United States Patent [19]

Horton

[11] 4,115,840
[45] Sep. 19, 1978

[54] PRINTED CIRCUIT BOARD WITH FLUOROCARBON COATED INDUCTOR

[75] Inventor: Steven A. Horton, Los Alamitos, Calif.

[73] Assignee: The Anaconda Company, Greenwich, Conn.

[21] Appl. No.: 664,688

[22] Filed: Mar. 8, 1976

Related U.S. Application Data

[62] Division of Ser. No. 504,773, Sep. 10, 1974, Pat. No. 3,973,321.

[51] Int. Cl.² ............................................. H05K 1/04
[52] U.S. Cl. ................................. 361/400; 361/411; 336/83; 336/136

[58] Field of Search .................. 336/83, 136; 361/397, 361/400, 411

[56] References Cited

U.S. PATENT DOCUMENTS

| | | | |
|---|---|---|---|
| 3,517,363 | 6/1970 | Curtis et al. | 336/83 |
| 3,693,252 | 9/1972 | Robertson et al. | 29/627 |
| 3,737,995 | 6/1973 | Utner et al. | 29/605 |
| 3,756,852 | 9/1973 | Scheetz et al. | 427/96 |

*Primary Examiner*—Edward A. Miller
*Attorney, Agent, or Firm*—Pennie & Edmonds

[57] ABSTRACT

A ferrite inductor is coated with fluorocarbon particles prior to attachment to a printed circuit board.

5 Claims, 4 Drawing Figures

U.S. Patent  Sept. 19, 1978  4,115,840
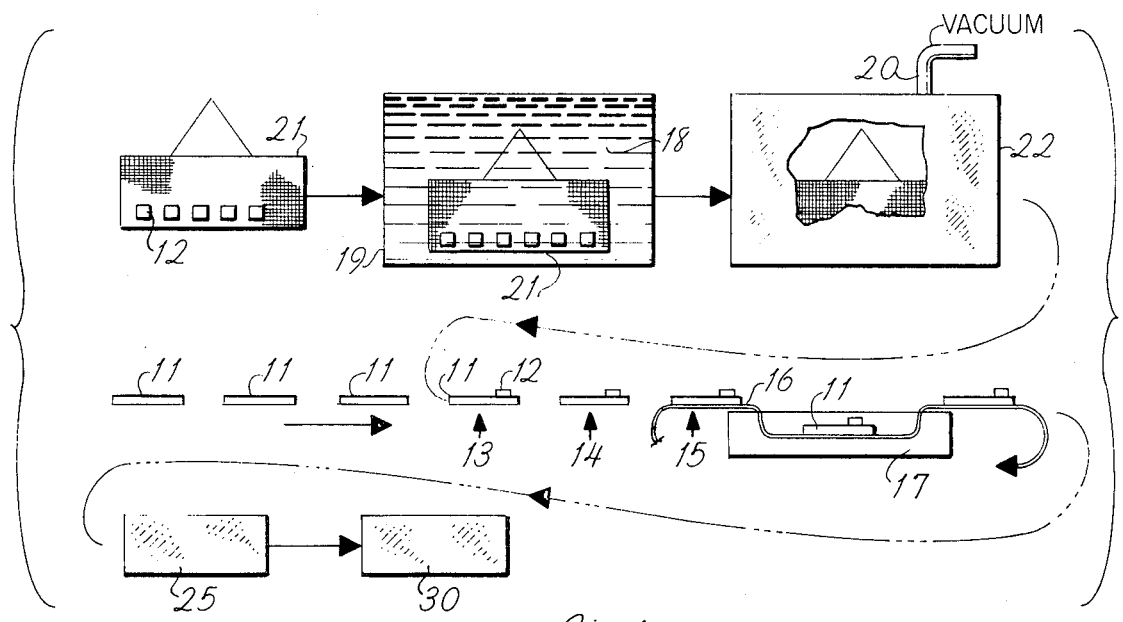
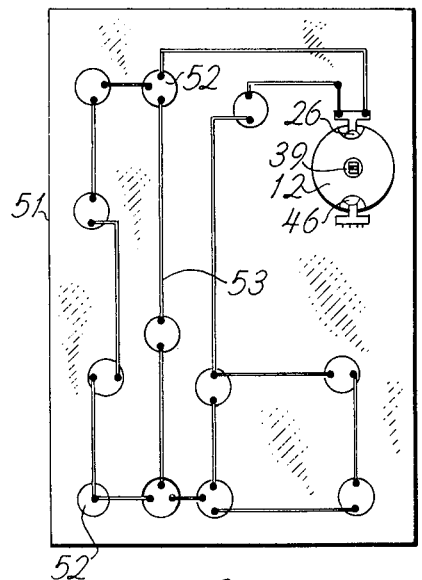
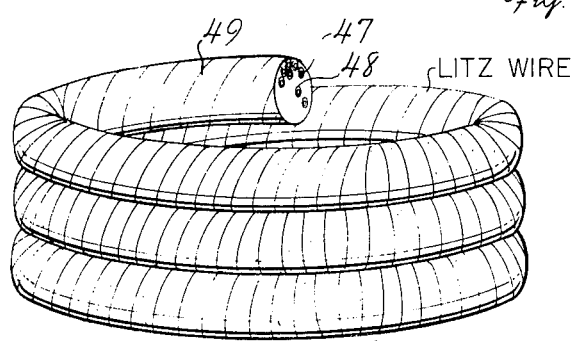
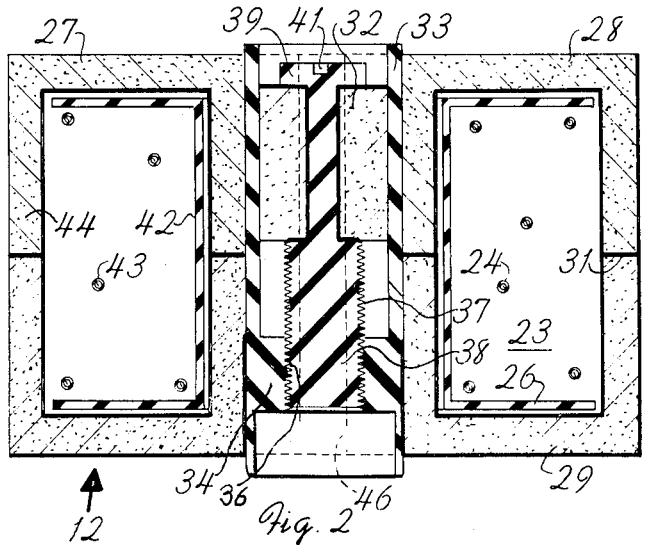

PRINTED CIRCUIT BOARD WITH FLUOROCARBON COATED INDUCTOR

CROSS REFERENCE TO RELEVANT APPLICATIONS

This is a division of application Ser. No. 504,773, filed Sept. 10, 1974, and issued as U.S. Pat. No. 3,973,321.

BACKGROUND OF THE INVENTION

In the manufacture of printed circuit boards it has been necessary to connect coils for inductors and transformers to the other board circuitry by physical attachment of the coils to the boards. In present practice the coils have ferrite cores, and, where tuning is required, the cores have tunable ferrite slugs. As the final step in the physical manufacture of a printed circuit board it is customary to apply a lacquer-like protective layer, known as a conformal coating, over the entire surface of the board. This is done by dipping the completed board in an acrylic solution. On a production basis printed circuit boards are carried on a conveyor through a tank of the solution and through an air drying station, following which they are stored for testing and final tuning of any tunable inductors. It has been found, however, that the final tubing is obstructed, in many instances, by the conformal coating which fills the fine threads of the tuning device and/or binds the slug in its off-tune position.

Although the conformal coating operation does apply a protective layer to the wire of the induction coil, it does not encapsulate the coil to a degree that moisture is excluded from the turns, and changes in moisture content can cause variations in the inductive reactance of inductors on conventional printed circuit boards. Sealing of the core containing the wire coil by means of silicone rubber has been practiced but this expedient has the disadvantages of high cost and the possible entrapment of any moisture that may find its way into the coil area.

SUMMARY

I have invented the method of preparing a printed circuit board that has attached to it a member that includes an induction coil which may have a ferrite core and may comprise an adjustable slug for the core. My method comprises the steps of coating the member with fine particles of a fluorocarbon polymer and then coating the entire board, including the member with a conformal coating which may comprise an acrylic resin. Preferably the member is immersed in a suspension of polytetrafluoroethylene particles in a liquid carrier such as 1,1,2 trichloro 1,2,2 trifluoroethane, and a small proportion, relative to the proportion of polytetrafluoroethylene, of polyperfluoropropylene is comprised in the suspension.

I have invented an inductor comprising a coil of insulated wire, a ferrite core, a helically threaded tubular surface associated with the core, an adjustable ferrite slug, a helically threaded cylindrical surface, fitting the tubular surface, associated with the slug, and a fine layer of particles of fluorocarbon polymer, such as polytetrafluoroethylene polymer which may advantageously be admixed with a small proportion of polyperfluoropropylene polymer, coating the wire and the threaded surfaces, which may be polymeric. A printed circuit board of my invention comprises at least one inductor which may comprise a ferrite core and an adjustable slug and a plurality of conducting surfaces and non-inductor circuit elements. The conducting surfaces and non-inductor circuit elements are covered with an adherent conformal coating while the inductor is free from adherence to the conformal coating and has its surfaces coated with a layer of fluorocarbon particles such as particles of polytetrafluoroethylene.

I have invented the improvement in litz wire coils where the litz wire comprises a large plurality of fine insulated metal filaments covered with a fibrous serving of having the serving impregnated with fine discrete fluorocarbon particles such as particles of polytetrafluoroethylene.

BRIEF DESCRIPTION OF THE DRAWING

FIG. 1 shows steps in an embodiment of the method of my invention.

FIG. 2 shows a section of an inductor comprising the improvement of my invention.

FIG. 3 shows a plan view of a printed circuit board of my invention.

FIG. 4 shows a section of a litz wire coil encompassing my invention

DETAILED DESCRIPTION OF PREFERRED EMBODIMENTS

With reference to FIG. 1 my novel method of making printed circuit boards will be described. Conventional printed circuit boards 11 to which inductors 12 are to be attached are advanced in an assembly line in the usual manner wherein at some station 13 the inductor 12 will be added to the board. Thereafter the board passes through additional stations for the addition of further circuit elements and for testing. Finally the completed board reaches a conveyor 16 which carries it through a tank 17 of conformal coating solution of which different formulations are known and used such solutions of acrylic resins. Upon leaving the tank 17 the conveyor 16 traverses a distance long enough to allow evaporation of the solvent of the conformal coating whereby a protective coating is applied to all exposed surfaces of the printed circuit board 11. Prior to application of the conformal coating and conveniently prior to its attachment to the printed circuit board at station 13 the inductor 12 is passed through steps that are essential to my method and that are not applied to those elements of the printed circuit board which do not comprise wire coils or tunable cores. In these steps the inductor 12 is immersed in a suspension 18 of polytetrafluoroethylene in a volatile carrier. As a carrier I prefer to use 1,1,2 trichloro 1,2,3 trifluoroethane but other volatile fluorinated and chlorinated hydrocarbons and ketones such as acetone or suitable blends thereof are included within the scope of my invention as a carrier for the suspension 18. The suspension 18 is maintained in a tank 19 and a large number of the inductors 12 are conveniently placed in a wire mesh basket 21 for immersion in the tank for 10 to 15 minutes. After the period of immersion has been completed the basket 21 is placed in a vacuum chamber 22 whence the volatile carrier is completely removed through an exhaust 20 and the treated inductors delivered in any convenient manner to the station 13. At station 25 the finished boards are tested and any adjustments that are found to be necessary are made at station 30. In commercial production a significant proportion of inductors has been found to require tuning following the conformal coating step and in a commercially disadvantageous number of these proper tuning of prior art inductors has been impossible due, usually, to jamming of the threaded slug, as shall be explained. Where this occurs and it is required to remove the inductor from the board and replace it with another, the cost is excessive. Following my introduction of a fluorocarbon treatment of the inductors in advance of the conformal coating steps fine tuning has been successfully accomplished in essentially 100% of the production in which it is necessary. The suspension in the tank 19 consists of a carrier of 93.9 weight percent 1,1,2 trichloro 1,2,2 trifluoroethane, 5.6 weight percent of polytetrafluoroethylene, and 0.5 weight percent of polyperfluoropropylene. The particle size of the polyfluorocarbon particles should have more than half the particles in the submicron range and substantially all under 10 microns. An actual count of the particle distribution is shown in the TABLE.

TABLE

| Fluorocarbon Particle Size Distribution | |
|---|---|
| Microns | % Number of Particles |
| less than 0.25 | 24 |
| 0.25 – 0.5 | 23 |
| 0.5 – 1.0 | 22 |
| 1 – 2 | 13 |
| 2 – 4 | 10 |
| 4 – 6 | 6 |
| 6 – 10 | 2 |

In FIG. 2 I have shown an induction coil 12 of a type for which my invention has particular applicability. The wire coil 23 is formed of a large number of turns of a litz wire 24 on a plastic bobbin 26 that is enclosed in a ferrite core 27. The core 27 has two half sections 28, 29 that have been cemented together at a seam 31 after the insertion of the filled bobbin 26. Tuning of the coil is accomplished by means of a ferrite slug 32 slidable in a plastic tube 33 having an annular thickened portion 34 with a threaded tubular surface 36. The threads forming the surface 36 match a threaded cylindrical surface 37 of a plastic plug 38 that is tightly attached to the slug 32. A screw head 39 with a slot 41 of the plug 38 enables the slug 32 to be accurately positioned within the coil 23 for fine adjustment of the coil impedance. My invention has been successfully practiced where the tube 33 and surface 36 are polycarbonate and the plug 38 and surface 37 are polyacetal. It is not believed, however, that the substance of these surfaces is critical to the practice of my invention. Indeed where the threaded surfaces are cut or formed directly into the ferrite, as is shown in U.S. Pat. No. 3,471,815 or in other ceramics, or plastics such, for example, as nylon, polypropylene, and polyimide my invention may be practiced advantageously.

When the coil 12 is immersed in the tank 19 a fine deposit of polyfluorocarbon particles forms on all the surfaces of the coil including the threaded surfaces 36 and 37. The particles also deposit upon a surface 42 of the bobbin 26 and an outer surface 43 of the wire 24. This is possible in spite of the enclosure of the bobbin 26 within the core 27 because the latter is slotted through its outer cylindrical wall 44 at a slot 46 that has the purpose of permitting access to the ends of the wires of the coil. It has been common to seal this slot 46 with a silicone rubber filling and it is an advantage of our invention that it has precluded the need for this relatively expensive sealing step. The litz wire 24 is made up of a large number, such as 85, No. 44 Awg (American Wire Gage) (0.05 mm) metal filaments or wires, 47 (FIG. 4), each with an enamel insulation 48 and twisted together in a bunch with a long right hand lay. The bunch is served with a fine fibrous rayon serving 49 having a left hand lay. The serving 49 is permeable to moisture which will change, somewhat, the specific inductive capacitance of the insulation 48. In my method the polyfluorocarbon particles penetrate the fibers of the serving 49 making it water repellant. These particles are discrete, by which I mean that, although some of them may be contiguous to each other or form small agglomerates and, due, apparently, to surface forces, will remain in position in the absence of a substantial washing action, the particles are not bound together or to the substrata by any organic adhesive or by fusion. To achieve this effect and also to penetrate between the surfaces 36 and 37 it is essential that sufficient polyfluorocarbon particles of a submicron size should be contained in the suspension within the tank 19. Although my invention does have particular advantage for coils made with litz wire, its usefulness is not restricted to such coils and I have found that tunable magnet wire coils also benefit from the new method.

The practice of my invention results in an improved printed circuit board of FIG. 3 having circuit elements indicated diagrammatically by the circles 52 interconnected by conducting surfaces 53. The board also includes one or more of the inductors 12 the surfaces of which, along with all the other board surfaces, have been treated to receive a conformal coating. However the conformal coating is adhesive to the surfaces of the board 51, elements 52, and conductors 53 but not to the surfaces of the inductor 12 which have been polyfluorocarbon coated.

In the selection of a suitable polyfluorocarbon for the practice of my invention I prefer the use of polytetrafluoroethylene as the principal active polymer. Other polymeric fluorocarbon particles such, for example, as chlorotrifluoroethylene and its copolymers with vinylidene fluoride, poly(ethylene-chloroflururoethylene), fluorinated ethylene-propylene and the homopolymer of vinylidene fluoride may also be used within the scope of my invention.

The foregoing description has been exemplary rather than definitive of my invention for which I desire an award of Letters Patent as defined in the following claims.

I claim:
1. An inductor comprising in combination:
   A. a coil of insulated wire,
   B. a ferrite core,
   C. a helically threaded tubular surface associated with said core,
   D. an adjustable ferrite slug,
   E. a helically threaded cylindrical surface associated with said slug and fitting said tubular surface,
   F. a fine layer of particles of fluorocarbon polymer coating said wire and said surfaces, said layer having been applied by immersion of the inductor in a bath of said polymer, a sufficient amount of said polymer having submicron size particles.

2. The inductor of claim 1 disposed onto a printed circuit board having a plurality of conducting surfaces and non-inductor circuit elements wherein an adherent conformal coating is applied thereto, and only said inductor being free from adherence to the adherent conformal coating.

3. The inductor of claim 1 wherein said polymer is polytetrafluoroethylene.

4. The inductor of claim 3 comprising a small proportion of particles of polyperfluoropropylene interspersed with said particles of polytetrafluoroethylene.

5. The inductor of claim 1 wherein said threaded surfaces are polymeric.

* * * * *